United States Patent
Kim et al.

(10) Patent No.: US 9,685,543 B2
(45) Date of Patent: Jun. 20, 2017

(54) THIN FILM ACTIVATION METHOD USING ELECTRICAL ENERGY AND THIN FILM TRANSISTOR FABRICATION METHOD

(71) Applicant: Industry-Academic Cooperation Foundation, Yonsei University, Seoul (KR)

(72) Inventors: Hyun Jae Kim, Seoul (KR); Doo Hyun Yoon, Seoul (KR); Tae Soo Jung, Seoul (KR); Young Jun Tak, Seoul (KR); Heesoo Lee, Seoul (KR); Wongi Kim, Goyang-si (KR); Jeong Woo Park, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/054,491

(22) Filed: Feb. 26, 2016

(65) Prior Publication Data
US 2016/0260821 A1  Sep. 8, 2016

(30) Foreign Application Priority Data
Mar. 4, 2015  (KR) ........................ 10-2015-0030151

(51) Int. Cl.
*H01L 29/66*  (2006.01)
*H01L 21/479*  (2006.01)
(Continued)

(52) U.S. Cl.
CPC ...... *H01L 29/66969* (2013.01); *H01L 21/477* (2013.01); *H01L 21/479* (2013.01); *H01L 29/42356* (2013.01); *H01L 29/7869* (2013.01)

(58) Field of Classification Search
CPC ............. H01L 29/66969; H01L 21/477; H01L 21/479; H01L 29/42356; H01L 29/7869
(Continued)

(56) References Cited

U.S. PATENT DOCUMENTS

| 6,541,323 B2* | 4/2003 | Yang ................. H01L 21/02488 257/E21.133 |
| 2006/0003660 A1* | 1/2006 | Kobayashi .............. H01J 9/027 445/5 |

(Continued)

FOREIGN PATENT DOCUMENTS

| JP | 2011139053 A | 7/2011 |
| KR | 20090117543 A | 11/2009 |

(Continued)

OTHER PUBLICATIONS

Sang-Seop Kim et al. "Studies of temperature dependent electrical characteristics of $SiO_2$, $SIN_x$ gate insulating film ITZO oxide semiconductor transistor". The Korean Vacuum Society, conference exerpt collection, p. 243. Aug. 2013.

*Primary Examiner* — Yasser A Abdelaziez
(74) *Attorney, Agent, or Firm* — Harness, Dickey & Pierce, P.L.C.

(57) ABSTRACT

The inventive concept relates to a thin film activation method, a thin film transistor fabrication method, and a substrate processing device, and more particularly, to a method of activating a thin film by using electrical energy, a method of fabricating a thin film transistor, and a device of processing a substrate. The thin film activation method according to an embodiment of the inventive concept may include supplying electrical energy to a thin film.

7 Claims, 7 Drawing Sheets

(51) Int. Cl.
*H01L 29/786* (2006.01)
*H01L 29/423* (2006.01)
*H01L 21/477* (2006.01)

(58) Field of Classification Search
USPC .......................................................... 438/104
See application file for complete search history.

(56) References Cited

U.S. PATENT DOCUMENTS

2013/0021228 A1* 1/2013 Miwa ................... G09G 3/3233
345/76
2014/0124712 A1 5/2014 Ye

FOREIGN PATENT DOCUMENTS

| KR | 20100057118 A | 5/2010 |
| KR | 20130126900 A | 11/2013 |
| KR | 101460489 B1 | 11/2014 |
| KR | 20150008316 A | 1/2015 |
| KR | 101488623 B1 | 2/2015 |
| WO | WO-2012044344 A1 | 4/2012 |

* cited by examiner

THIN FILM ACTIVATION METHOD USING ELECTRICAL ENERGY AND THIN FILM TRANSISTOR FABRICATION METHOD

CROSS-REFERENCE TO RELATED APPLICATIONS

This U.S. non-provisional patent application claims priority under 35 U.S.C. §119 of Korean Patent Application No. 10-2015-0030151, filed on Mar. 4, 2015, the entire contents of which are hereby incorporated by reference.

BACKGROUND

The present disclosure herein relates to a thin film activation method, a thin film transistor fabrication method, and a substrate processing device, and more particularly, to a method of activating a thin film by using electrical energy, a method of fabricating a thin film transistor, and a device of processing a substrate.

Currently, the channel layer of an oxide thin film transistor is being mostly deposited by using sputtering. Since in the oxide thin film that is deposited by sputtering, materials making up of the thin film are coupled only physically, a separate activation process is needed to enable the thin film to function as the channel layer of a switching device.

Typically, the thin film is thermally treated at a temperature equal to or higher than about 300° C. for the thin film activation so that the materials in the thin film are chemically coupled. However, when the activation that uses the high temperature treatment is applied to a plastic substrate or flexible substrate, there is a limitation in that it is difficult to use a device due to substrate deformation or melting.

SUMMARY

The present disclosure provides a thin film activation method, a thin film transistor fabrication method, and a substrate processing device that may be applied to a substrate vulnerable to heat.

The present disclosure also provides a thin film activation method, a thin film transistor fabrication method, and a substrate processing device that may lower heat treatment temperature needed for thin film activation.

An embodiment of the inventive concept provides a thin film activation method that includes supplying electrical energy to a thin film.

Thin film may include an oxide thin film.

The oxide thin film may include a metal oxide thin film.

The metal oxide thin film may include at least one of: single-component metal oxide; or multi-component metal oxide that comprises two-component metal oxide or three-component metal oxide.

The thin film may be a vacuum-deposited thin film.

The vacuum-deposited thin film may be a thin film that is deposited by using of at least one of sputtering, chemical vapor deposition, atomic layer deposition, or evaporation deposition.

The supplying of the electrical energy to the thin film may include applying voltages to some or all of electrodes that are formed to be in contact with the thin film, and electrodes that are disposed between the thin film and another thin film.

The applying of the voltages to the electrodes may include applying the voltages to the electrodes to enable a voltage difference to be formed between a first electrode and a second electrode among a plurality of electrodes.

The supplying of the electrical energy to the thin film may include supplying other energy along with the electrical energy to the thin film.

The supplying of the other energy along with the electrical energy to the thin film may include supplying thermal energy along with the electrical energy to the thin film.

The supplying of the thermal energy along with the electrical energy to the thin film may include heating the thin film while applying voltages to some or all of electrodes that are formed to be in contact with the thin film, and electrodes that are disposed between the thin film and another thin film.

The heating of the thin film while applying the voltages to the electrodes may include heating the thin film at a temperature higher than about 100° C. and lower than about 300° C. while applying the voltages to the electrodes to enable a voltage difference to be formed between a first electrode and a second electrode among a plurality of electrodes.

The heating of the thin film at the temperature higher than about 100° C. and lower than about 300° C. while applying the voltages to the electrodes to enable the voltage difference to be formed between the first electrode and the second electrode may include heating the thin film at the temperature higher than about 100° C. and lower than about 300° C. for about one hour to about two hours while applying the voltages to the electrodes to enable the voltage difference to be formed between the first electrode and the second electrode.

In an embodiments of the inventive concept, a thin film transistor fabrication method includes forming a gate on a substrate; forming a gate insulating layer on the gate; forming a channel layer on the gate insulating layer; forming a source and a drain on the channel layer; and supplying electrical energy to the channel layer to activate the channel layer.

The channel layer may include a metal oxide thin film.

The forming of the channel layer may include vacuum-depositing the metal oxide thin film on the gate insulating layer.

The vacuum-depositing of the metal oxide thin film may include sputtering-depositing the metal oxide thin film on the gate insulating layer.

The forming of the channel layer may include supplying thermal energy along with electrical energy to the channel layer.

The supplying of the thermal energy along with the electrical energy to the channel layer may include heating the channel layer while applying a voltage to at least one of the gate, the source, or the drain.

The heating of the channel layer while applying the voltage to at least one of the gate, the source, or the drain may include heating the channel layer while applying the voltage to enable a voltage difference to be formed between one or both of the gate and the drain and the source.

The heating of the channel layer while applying the voltage to enable the voltage difference to be formed between one or both of the gate and the drain and the source may include heating the channel layer while applying the voltage to enable a voltage of one or both of the gate and the drain to be higher than a voltage of the source.

The heating of the channel layer while applying the voltage to enable the voltage of one or both of the gate and the drain to be higher than the voltage of the source may include heating the channel layer while applying the voltage to enable the voltage of the source to be the lowest, the voltage of the gate to be the highest, and the voltage of the drain to be lower than or equal to the voltage of the gate.

The heating of the channel layer while applying the voltage to at least one of the gate, the source, or the drain may include heating the channel layer at a temperature higher than 100° C. and lower than 300° C. while applying the voltage to at least one of the gate, the source, or the drain.

The heating of the channel layer at the temperature higher than 100° C. and lower than 300° C. may include heating the channel layer at the temperature higher than 100° C. and lower than 300° C. for about one hour to about two hours while applying the voltage to at least one of the gate, the source, or the drain.

In an embodiment of the inventive concept, a substrate processing device is a device that processes a substrate in order to activate a thin film formed on the substrate, and includes a support on which the substrate is disposed, and a power supply unit that outputs an electrical signal in order to supply electrical energy to the thin film.

The power supply unit may apply voltages to some or all of electrodes that are formed in contact with the thin film through a probe, and an electrode that is disposed between the thin film and another thin film.

The substrate processing device may further include a heat emitting portion that emits heat in order to supply thermal energy to the thin film.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Other advantages and features of the inventive concept, and implementation methods thereof will be clarified through following embodiments to be described in detail with reference to the accompanying drawings. The inventive concept may, however, be embodied in different forms and should not be construed as limited to the embodiments set forth herein. Rather, these embodiments are provided so that the present disclosure is thorough and complete and fully conveys the scope of the inventive concept to a person skilled in the art to which the inventive concept pertains. Further, the inventive concept is only defined by scopes of claims.

Even if not defined, all the terms used herein (including technology or science terms) have the same meanings as those generally accepted by typical technologies in the related art to which the inventive concept pertains. The terms defined in general dictionaries may be construed as having the same meanings as those used in the related art and/or a text of the present application and even when some terms are not clearly defined, they should not be construed as being conceptual or excessively formal.

The terms used herein are only for explaining embodiments and not intended to limit the inventive concept. The terms in a singular form in the present disclosure also include plural forms unless otherwise specified. The terms used herein "includes", "comprises", "including" and/or "comprising" do not exclude the presence or addition of one or more compositions, ingredients, components, steps, operations and/or elements other than the compositions, ingredients, components, steps, operations and/or elements that are mentioned. In the present disclosure, the term "and/or" indicates each of enumerated components or various combinations thereof.

Embodiments of the inventive concept are described below in detail with reference to the drawings attached to the present disclosure.

Figure 1:
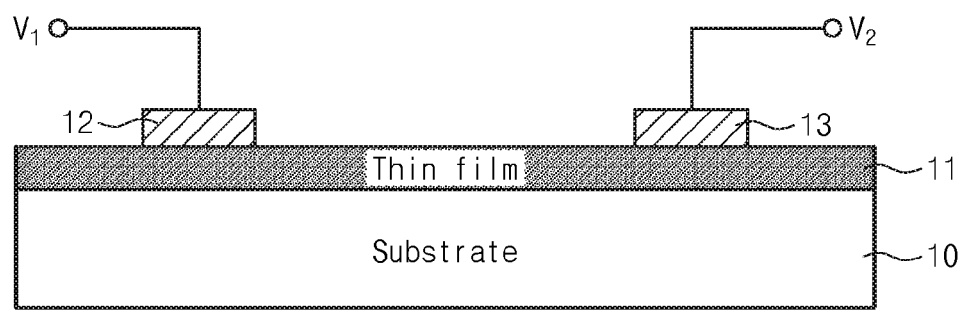
FIG. 1 is a schematic cross-sectional view of a thin film activation method according to an embodiment of the inventive concept.

FIG. 1 is a schematic cross-sectional view of a thin film activation method according to an embodiment of the inventive concept.

Referring to FIG. 1, the thin film activation method may include supplying electrical energy to a thin film 11. The thin film 11 is formed on a substrate 10 and receives an electrical signal through electrodes 12 and 13 to receive electrical energy.

The thin film 11 may include an oxide thin film. According to an embodiment, the oxide thin film may include a metal oxide thin film.

In particular, the metal oxide thin film may be single-component metal oxide, such as ZnO, InO, SnO, two-component metal oxide, such as InZnO, InGaO, ZnSnO, or three-component metal oxide, such as InGaZnO. According to an embodiment, the metal oxide thin film may also include at least one of the single-component metal oxide or the multi-component metal oxide.

According to an embodiment of the inventive concept, the activated thin film 11 may be the thin film 11 that is vacuum-deposited. The vacuum-deposited thin film 11 may be the thin film 11 that is deposited by sputtering. The sputtering is a technique that enables ion to collide with a target to jet atoms or molecules making up of the target so that they are attached to a substrate. Thus, since materials making up the sputtering-deposited thin film 11 are coupled only physically, not chemically, there is a need to provide a semiconductor characteristic to the thin film 11 through a separate activation process.

Thus, an embodiment of the inventive concept presents a new technology that supplies electrical energy to the thin film 11 to activate the thin film 11. However, the activation method according to an embodiment of the inventive concept may be applied to not only the thin film 11 that is deposited by sputtering, but also a thin film that is deposited by using other vacuum deposition techniques, such as chemical vapor deposition, atomic layer deposition, evaporation deposition and the like.

According to an embodiment of the inventive concept, supplying the electrical energy to the thin film 11 may include applying a voltage to an electrode that is formed to be in contact with the thin film 11.

As shown in FIG. 1, e.g., one or more electrodes 12 and 13 may be formed on the thin film 11, and voltages $V_1$ and $V_2$ are applied to one or both of the electrodes 12 and 13 so that the electrical energy may be applied to the thin film 11.

According to another embodiment, supplying the electrical energy to the thin film 11 may include applying voltages to not only the electrodes 12 and 13 that are formed to be in contact with the thin film 11, but also an electrode (not shown) that is disposed between the thin film 11 and another thin film. In other words, the electrode to which the voltage is applied in order to activate the thin film 11 may also be an electrode that is formed on another thin film adjacent to the thin film 11 as well as the electrodes 12 and 13 that are directly formed on a corresponding thin film 11.

As such, supplying the electrical energy to the thin film 11 may include applying voltages to some or all of the electrodes 12 and 13 that are formed to be in contact with the thin film 11, and electrodes that are disposed between the thin film 11 and another thin film.

According to an embodiment of the inventive concept, applying the voltage to the electrode may include applying the voltages to the electrodes so that a voltage difference is formed between a first electrode and a second electrode among a plurality of electrodes.

For example, in order to supply the electrical energy to the thin film 11 to activate the thin film, it is possible to apply voltages $V_1$ and $V_2$ to the electrodes 12 and 13, respectively so that a voltage difference $V_1$-$V_2$ is formed between a first electrode 12 and a second electrode 13.

According to another embodiment of the inventive concept, supplying the electrical energy to the thin film 11 may include supplying other energy along with the electrical energy to the thin film 11.

Figure 2:
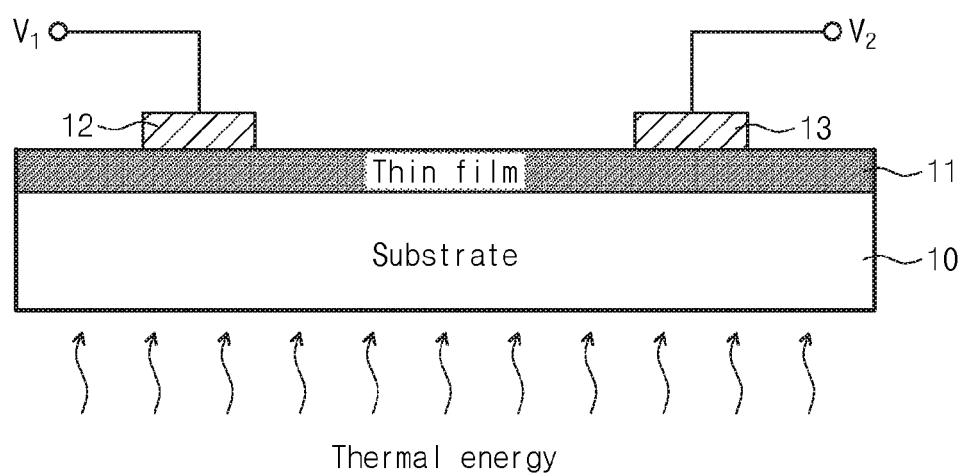
FIG. 2 is a schematic cross-sectional view of a thin film activation method according to another embodiment of the inventive concept.

FIG. 2 is a schematic cross-sectional view of a thin film activation method according to another embodiment of the inventive concept.

Referring to FIG. 2, supplying the other energy along with the electrical energy to the thin film 11 may include supplying thermal energy along with the electrical energy to the thin film 11. In this case, since the thin film 11 may also receive the thermal energy while supplying the electrical energy, the coupling between components may vary.

Supplying the thermal energy along with the electrical energy to the thin film 11 may include heating the thin film 11 while applying voltages to some or all of the electrodes 12 and 13 that are formed to be in contact with the thin film 11, and electrodes (not shown) that are disposed between the thin film 11 and another thin film.

According to an embodiment of the inventive concept, heating the thin film 11 while applying the voltages to the electrodes may include heating the thin film 11 at a temperature higher than about 100° C. and lower than about 300° C. while applying the voltages to the electrodes so that a voltage difference is formed between a first electrode and a second electrode among a plurality of electrodes.

Heating the thin film at the temperature higher than about 100° C. and lower than about 300° C. while applying the voltages to the electrodes so that the voltage difference is formed between the first electrode and the second electrode may include heating the thin film 11 at the temperature higher than about 100° C. and lower than about 300° C. for about half an hour to about two hours, in particular, for about one hour to about two hours while applying the voltages to the electrodes so that the voltage difference is formed between the first electrode and the second electrode.

Figure 3:
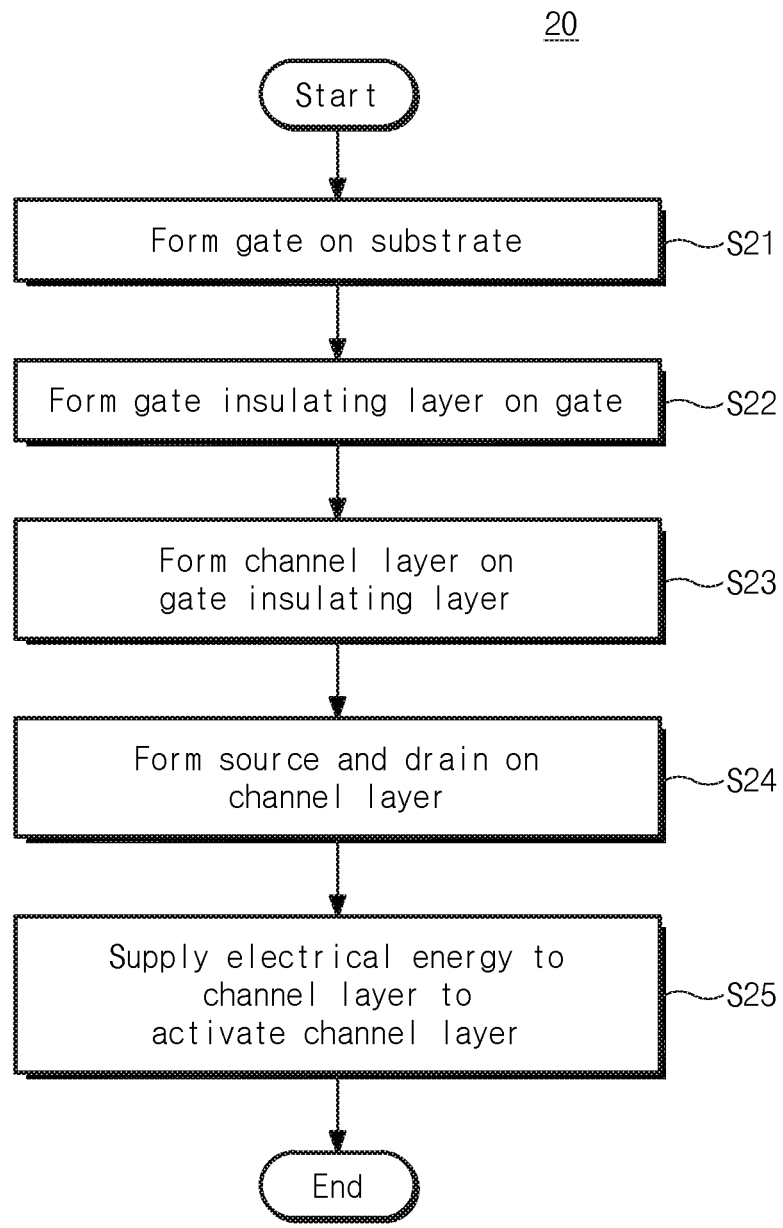
FIG. 3 is an exemplary flowchart of a thin film transistor fabrication method according to an embodiment of the inventive concept.
Figure 4:
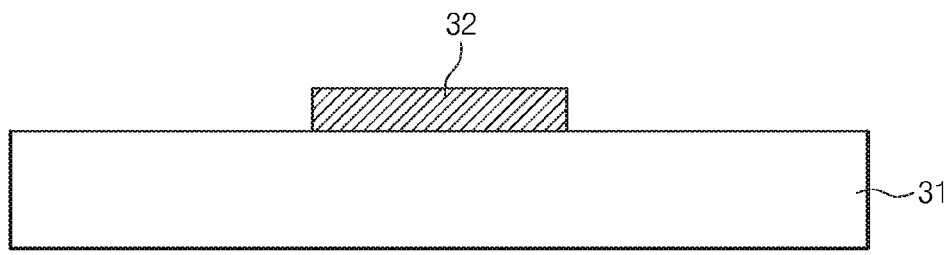
FIGS. 4 to 8 are exemplary diagrams for explaining the process of fabricating a thin film transistor according to an embodiment of the inventive concept.
Figure 5:
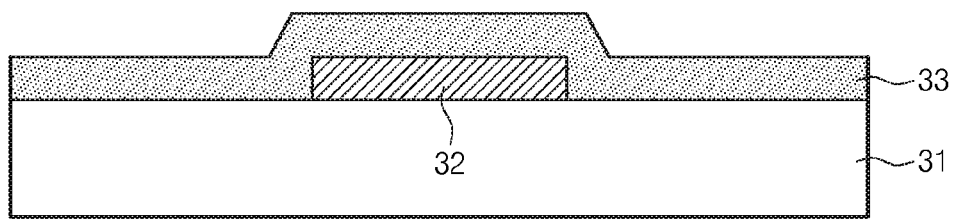
Figure 6:
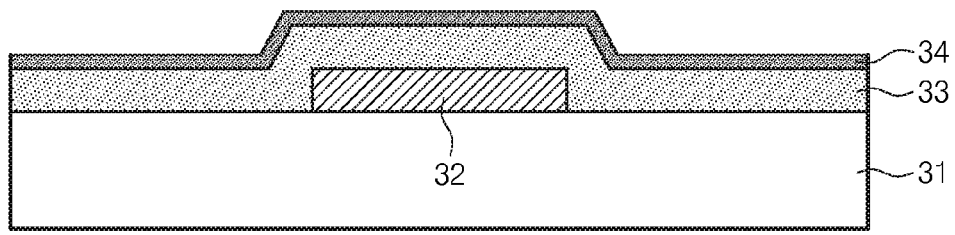
Figure 7:
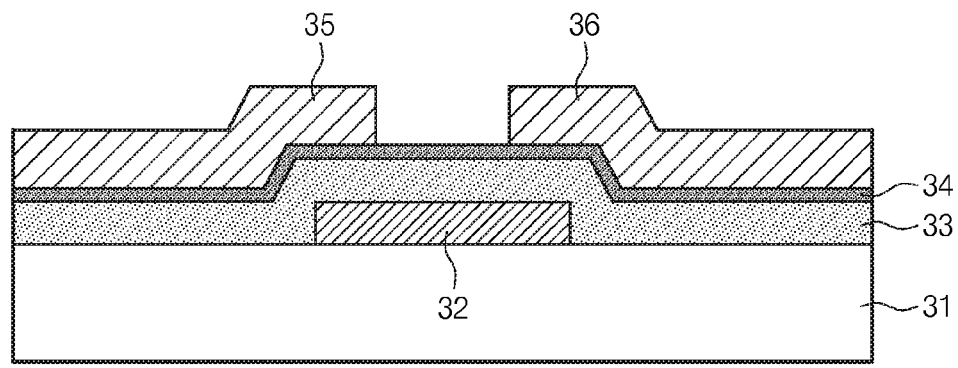

FIG. 3 is an exemplary flowchart of a thin film transistor fabrication method 20 according to an embodiment of the inventive concept, and FIGS. 4 to 8 are exemplary diagrams for explaining the process of fabricating a thin film transistor according to an embodiment of the inventive concept.

Figure 8:
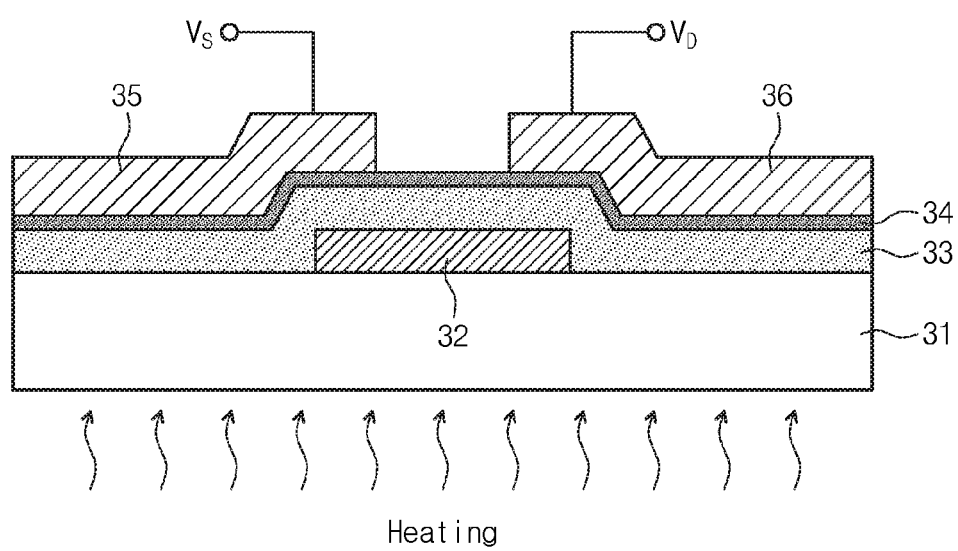

Referring to FIGS. 3 to 8, the thin film transistor fabrication method 20 may include forming a gate 32 on a substrate 31 in step S21 (see FIG. 4), forming a gate insulating layer 33 on the gate 32 in step S22 (see FIG. 5), forming a channel layer 34 on the gate insulating layer 33 in step S23 (see FIG. 6), forming a source 35 and a drain 36 on the channel layer 34 in step S24 (see FIG. 7), and supplying electrical energy to the channel layer 34 to activate the channel layer 34 in step S25 (See FIG. 8).

The channel layer 34 may include a metal oxide thin film.

In addition, forming the channel layer 34 in step S23 may include vacuum-depositing the metal oxide thin film on the gate insulating layer 33.

In this example, vacuum-depositing the metal oxide thin film may include sputtering-depositing the metal oxide thin film on the gate insulating layer 33 but the depositing of the thin film is not limited to the sputtering deposition.

According to an embodiment, activating the channel layer 34 in step S25 may include supplying thermal energy along with the electrical energy to the channel layer 34.

In particular, referring to FIG. 8, supplying the thermal energy along with the electrical energy to the channel layer 34 may include heating the channel layer 34 while applying a voltage to at least one of the gate 32, the source 35, or the drain 36.

Although FIG. 8 does not show the applying of a voltage to the gate 32, it is possible to expose, through a shadow mask, a portion of the flat surface of the gate 32 to which an electrical signal is applied, in a device manufacturing process to enable the gate 32 to include the portion to which the electrical signal is applied, if a voltage is also applied to the gate 32 that is covered with the gate insulating layer 33 and the channel layer 34.

According to an embodiment of the inventive concept, heating the channel layer 34 while applying the voltage to at least one of the gate 32, the source 35, or the drain 36 may include heating the channel layer 34 while applying the voltage so that a voltage difference is formed between one or both of the gate 32 and the drain 36 and the source 35.

For example, heating the channel layer 34 while applying the voltage so that the voltage difference is formed between one or both of the gate 32 and the drain 36 and the source 35 may include heating the channel layer 34 while applying the voltage so that the voltage $V_G$, $V_D$ of one or both of the gate 32 and the drain 36 is higher than the voltage $V_S$ of the source 35. In this case, $V_G$>$V_S$, $V_D$>$V_S$, or $V_G$ and $V_D$>$V_S$.

Furthermore, heating the channel layer 34 while applying the voltage so that the voltage of one or both of the gate 32 and the drain 36 is higher than the voltage of the source 35 may include heating the channel layer 34 while applying the voltage so that the voltage of the source 35 is the lowest, the voltage of the gate 32 is the highest, and the voltage of the drain 36 is lower than or equal to the voltage of the gate 32. In this case, $V_G$≥$V_D$>$V_S$.

According to the present embodiment, the source 35 may be grounded, a voltage of about 50 V may be applied to the gate 32, and a voltage of about 10.1 V to about 50 V may be applied to the drain 36.

Also, heating the channel layer 34 while applying the voltage to at least one of the gate 32, the source 35, or the drain 36 may include heating the channel layer 34 at a temperature higher than 100° C. and lower than 300° C. while applying the voltage to at least one of the gate 32, the source 35, or the drain 36.

In this case, heating the channel layer 34 at the temperature higher than 100° C. and lower than 300° C. may include heating the channel layer 34 at the temperature higher than 100° C. and lower than 300° C. for about half an hour to about two hours, in particular, for about one hour to about two hours while applying the voltage to at least one of the gate 32, the source 35, or the drain 36.

Figure 9:
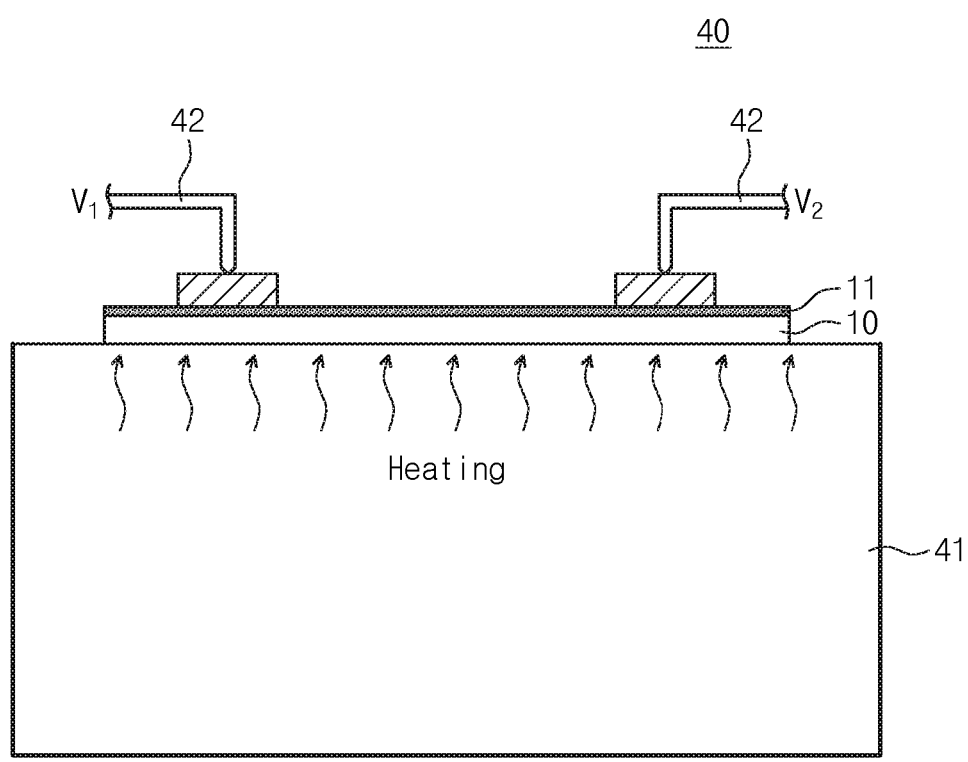
FIG. 9 is an exemplary diagram for explaining the process of activating, by a substrate processing device, a thin film according to an embodiment of the inventive concept.

FIG. 9 is an exemplary diagram for explaining the process of activating, by a substrate processing device 40, a thin film 11 according to an embodiment of the inventive concept.

The substrate processing device 40 is a device that processes a substrate 10 in order to activate the thin film 11 that is formed on the substrate 10 according to the embodiment of the inventive concept as described above, and may include a support 41 on which the substrate 10 is disposed, and a power supply unit (not shown) that outputs an electrical signal in order to supply electrical energy to the thin film 11.

Referring to FIG. 9, the power supply unit may apply voltages to some or all of electrodes 12 and 13 that are formed in contact with the thin film 11 through a probe 42, and an electrode (e.g., gate 32 in FIG. 8) that is disposed between the thin film 11 and another thin film.

Furthermore, the substrate processing device 40 may further include a heat emitting portion that emits heat in order to supply thermal energy to the thin film 11. Although not shown, the heat emitting portion may be disposed at the support 41 to heat the substrate 10 directly.

The inventor has fabricated an InGaZnO thin film transistor to measure transfer characteristics in order to examine the effect of thin film activation using electrical energy of the inventive concept.

In particular, the inventor has fabricated a bottom gate type thin film transistor and used a boron doped P-type silicon wafer as a substrate to replace a gate electrode. In addition, $SiO_2$ has grown by about 120 nm on the substrate by a dry oxidation technique to form the gate insulating layer. Then, ultrasonic washing has been performed on the P+ silicon substrate on which the gate insulating layer is formed, in order of acetone and methanol for ten minutes respectively, and then the substrate has been blurred by the using of a nitrogen gun.

Then, an InGaZnO thin film has been deposited on the gate insulating layer through sputtering, in which case the mole fraction of metallic materials in the InGaZnO was In:Ga:Zn=1:1:1. A chamber was under argon atmosphere upon sputtering, and an operating pressure was $5\times10^{-3}$ Torr. In addition, the sputtering has been performed for about five minutes at about 150 W, in which case the thickness of the InGaZnO thin film was about 40 nm.

Then, aluminum has been thermally deposited by about 200 nm on the InGaZnO thin film to form source and drain electrodes. In this case, the width and length of a channel were formed to be about 1000 μm and about 150 μm, respectively by using a shadow mask.

Then, in order to activate the InGaZnO thin film according to an embodiment of the inventive concept, voltages have been applied to the source, the gate and the drain with a probe station tip, while the substrate is heated on a hot plate. For comparison, the substrate has been heated at about 200° C. for about one hour to activate the thin film.

Figure 10:
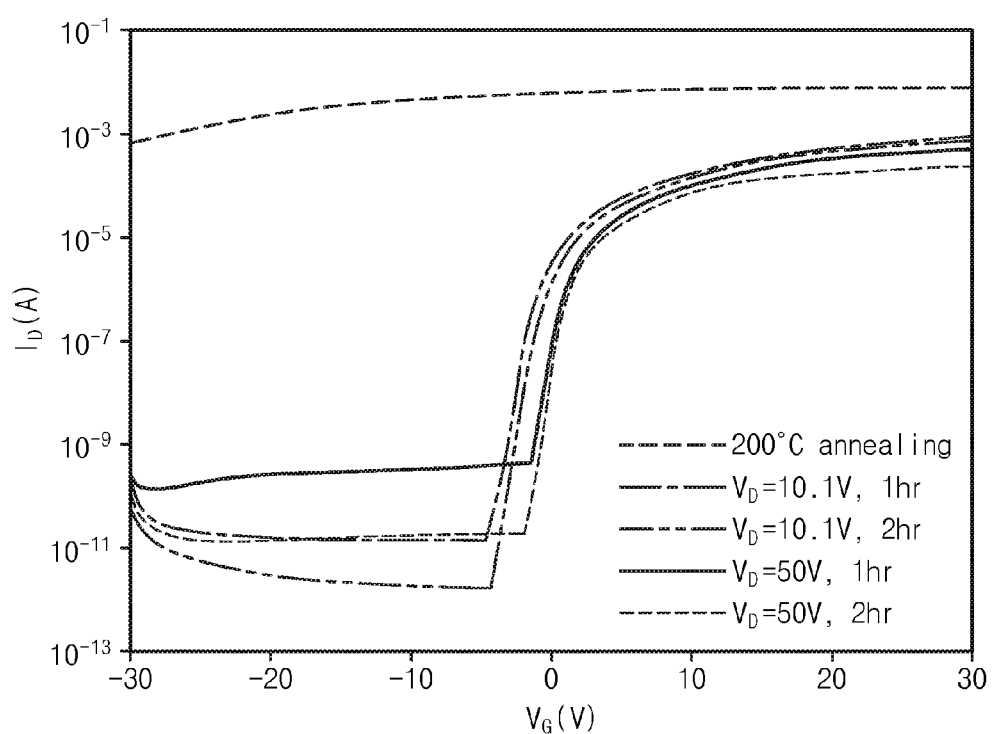
FIG. 10 shows transfer curves of InGaZnO thin film transistors that are activated by the grounding of a source, the applying of about 50 V to a gate, and applying of about 10.1 V or about 50 V to a drain, for about one hour or about two hours at about 100° C.
Figure 11:
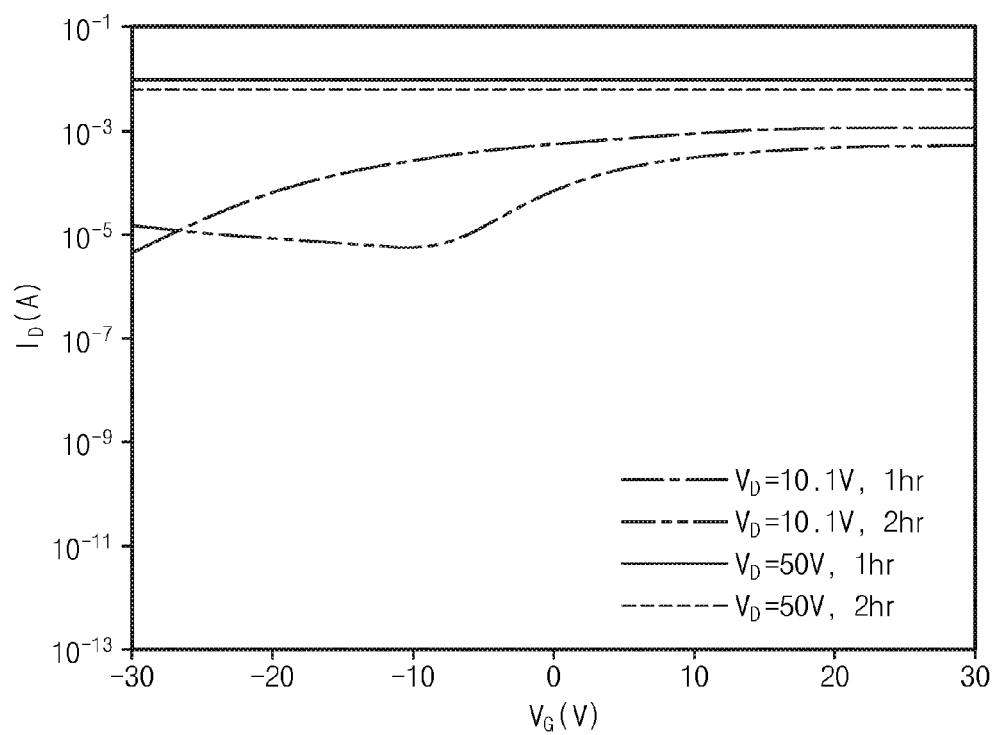
FIG. 11 shows transfer curves of an InGaZnO thin film transistor that is activated by heat treatment for about one hour at about 200° C. , and of InGaZnO thin film transistors that are activated by the grounding of a source, the applying of about 50 V to a gate, and applying of about 10.1 V or about 50 V to a drain, for about one hour or about two hours at about 200° C.

FIG. 11 shows transfer curves of InGaZnO thin film transistors that are activated by the grounding of a source, the applying of about 50 V to a gate, and applying of about 10.1 V or about 50 V to a drain, for about one hour or about two hours at about 100° C., and FIG. 10 shows transfer curves of an InGaZnO thin film transistor that is activated by heat treatment for about one hour at about 200° C., and of InGaZnO thin film transistors that are activated by the grounding of a source, the applying of about 50 V to a gate, and applying of about 10.1 V or about 50 V to a drain, for about one hour or about two hours at about 200° C.

Referring to FIG. 11, it may be seen that the thin film has not been activated, because devices that are processed at about 100° C. do not represent switching characteristics irrespective of applied voltages.

Referring to FIG. 10, it may be seen that the device on which only thermal treatment has been performed without the applying of a voltage at about 200° C. does not represent a switching characteristic but devices to which voltages have been applied as well as thermal treatment at about 200° C. represent semiconductor characteristics through the thin film because they are clearly divided into on and off states.

The mobility, on/off current ratio, sub-threshold swing (S.S.) and threshold voltage $V_{th}$ of the activated thin film transistor as shown in FIG. 10 are shown in the following table. Since the thin film transistor activated according to a comparative example does not represent the switching characteristic, measurement has not been performed.

TABLE 1

| $V_D$ (V)/Processing hour (hr) | Mobility ($cm^2/V_s$) | On/Off current ratio | S.S. (mV/decade) | $V_{th}$ (V) |
| --- | --- | --- | --- | --- |
| 10.1/1 | 13.58 | $5.24 \times 10^7$ | 0.78 | −0.87 |
| 10.1/2 | 11.68 | $3.71 \times 10^8$ | 0.68 | −0.74 |
| 50/1 | 9.22 | $3.21 \times 10^6$ | 0.67 | 0.28 |
| 50/2 | 8.84 | $2.06 \times 10^7$ | 0.55 | 0.57 |

According to an embodiment of the inventive concept, it is possible to activate the thin film that is formed on a substrate vulnerable to heat.

According to an embodiment, it is possible to lower a heat treatment temperature needed for thin film activation to increase the availability of a plastic substrate or flexible substrate.

Although the inventive concept is described above through embodiments, the embodiments above are only provided to describe the spirit of the inventive concept and not intended to limit the inventive concept. A person skilled in the art would understand that various modifications to the above-described embodiments may be implemented. The scope of the inventive concept is defined only by the following claims.

What is claimed is:

1. A thin film transistor fabrication method comprising:
   forming a gate on a substrate;
   forming a gate insulating layer on the gate;
   forming a channel layer on the gate insulating layer;
   forming a source and a drain on the channel layer; and
   supplying electrical energy to the channel layer to activate the channel layer, wherein the forming of the channel layer comprises supplying thermal energy along with electrical energy to the channel layer, wherein the supplying thermal energy along with electrical energy to the channel layer comprises heating the channel layer while applying a voltage to at least one of the gate, the source, or the drain.

2. The thin film transistor fabrication method of claim 1, wherein the channel layer comprises a metal oxide thin film.

3. The thin film transistor fabrication method of claim 2, wherein the forming of the channel layer comprises vacuum-depositing the metal oxide thin film on the gate insulating layer.

4. The thin film transistor fabrication method of claim 3, wherein the vacuum-depositing of the metal oxide thin film comprises sputtering-depositing the metal oxide thin film on the gate insulating layer.

5. The thin film transistor fabrication method of claim 1, wherein the heating of the channel layer while applying the voltage to at least one of the gate, the source, or the drain comprises heating the channel layer while applying the voltage to enable a voltage difference to be formed between one or both of the gate and the drain and the source.

6. The thin film transistor fabrication method of claim 5, wherein the heating of the channel layer while applying the voltage to enable the voltage difference to be formed between one or both of the gate and the drain and the source comprises heating the channel layer while applying the voltage to enable a voltage of one or both of the gate and the drain to be higher than a voltage of the source.

7. The thin film transistor fabrication method of claim 6, wherein the heating of the channel layer while applying the voltage to enable the voltage of one or both of the gate and the drain to be higher than the voltage of the source comprises heating the channel layer while applying the voltage to enable the voltage of the source to be the lowest, the voltage of the gate to be the highest, and the voltage of the drain to be lower than or equal to the voltage of the gate.

\* \* \* \* \*